(12) United States Patent
Hu

(10) Patent No.: US 9,263,373 B2
(45) Date of Patent: Feb. 16, 2016

(54) THIN FILM RDL FOR NANOCHIP PACKAGE

(71) Applicant: Dyi-Chung Hu, Hsinchu (TW)

(72) Inventor: Dyi-Chung Hu, Hsinchu (TW)

(*) Notice: Subject to any disclaimer, the term of this patent is extended or adjusted under 35 U.S.C. 154(b) by 0 days.

(21) Appl. No.: 14/700,624

(22) Filed: Apr. 30, 2015

(65) Prior Publication Data

US 2015/0371932 A1 Dec. 24, 2015

Related U.S. Application Data

(63) Continuation-in-part of application No. 14/509,395, filed on Oct. 8, 2014, which is a continuation-in-part of application No. 14/308,702, filed on Jun. 18, 2014, now abandoned.

(51) Int. Cl.

| | |
|---|---|
| *H01L 23/48* | (2006.01) |
| *H01L 23/52* | (2006.01) |
| *H01L 29/40* | (2006.01) |
| *H01L 23/495* | (2006.01) |
| *H01L 21/48* | (2006.01) |

(52) U.S. Cl.
CPC ...... *H01L 23/49541* (2013.01); *H01L 21/4825* (2013.01); *H01L 23/49524* (2013.01); *H01L 23/49527* (2013.01)

(58) Field of Classification Search
CPC .............. H01L 23/49816; H01L 23/3128; H01L 24/97; H01L 2924/14
USPC .......... 257/778, 784, 758; 438/108, 125, 622; 977/715, 723
See application file for complete search history.

(56) References Cited

U.S. PATENT DOCUMENTS

| | | | | |
|---|---|---|---|---|
| 7,884,488 B2* | 2/2011 | Hedler | ................. | H01L 22/32 |
| | | | | 257/784 |
| 2004/0021232 A1* | 2/2004 | Pekin | ................. | H01L 22/34 |
| | | | | 257/778 |
| 2013/0168841 A1* | 7/2013 | Zhao | ................. | H05K 1/029 |
| | | | | 257/676 |
| 2014/0102777 A1 | 4/2014 | Chen et al. | | |
| 2015/0069623 A1* | 3/2015 | Tsai | ................. | H01L 23/3128 |
| | | | | 257/774 |

* cited by examiner

*Primary Examiner* — S. V. Clark
(74) *Attorney, Agent, or Firm* — Hauptman Ham, LLP

(57) ABSTRACT

A high density film adapted for nanochip package comprises three redistribution layers. A bottom redistribution circuit has a plurality of first bottom pads adapted for a nanochip to mount; and has a plurality of first top pads. The density of the first bottom pads is higher than the density of the first top pads. A middle redistribution circuit has a plurality of second bottom pads electrically coupled to the first top pads; and has a plurality of second top pads. The density of the second bottom pads is higher than the density of the second top pads. A top redistribution circuit has a plurality of third bottom pads electrically coupled to the second top pads; and has a plurality of third top pads. The density of the third bottom pads is higher than the density of the third top pads.

10 Claims, 18 Drawing Sheets

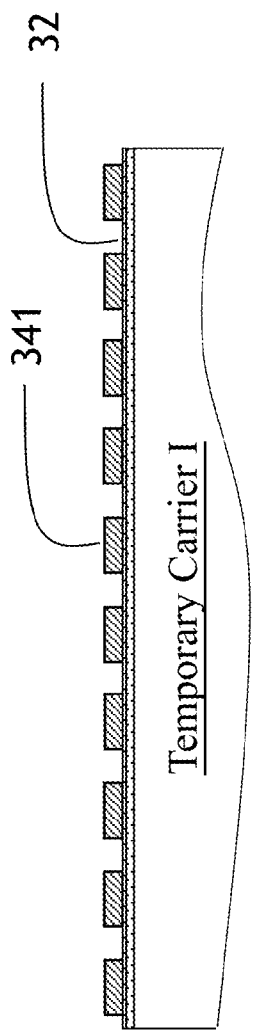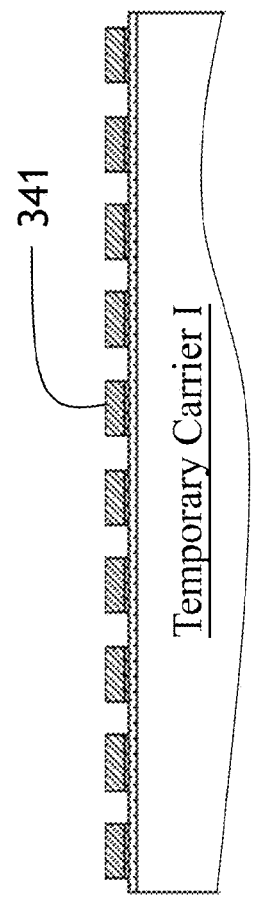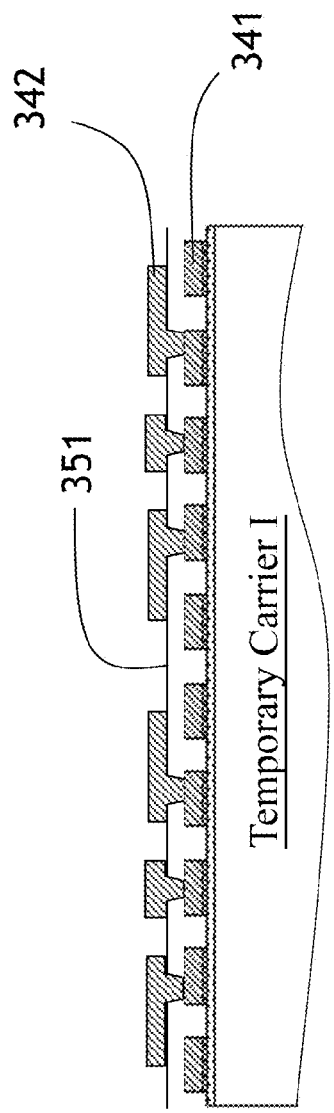

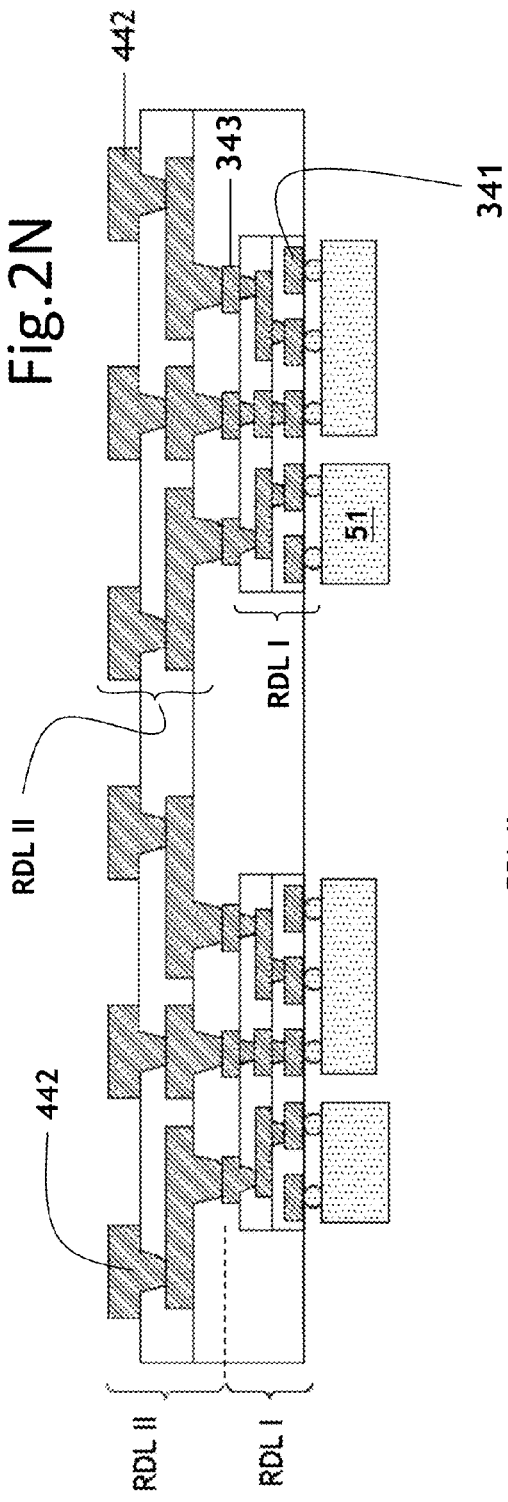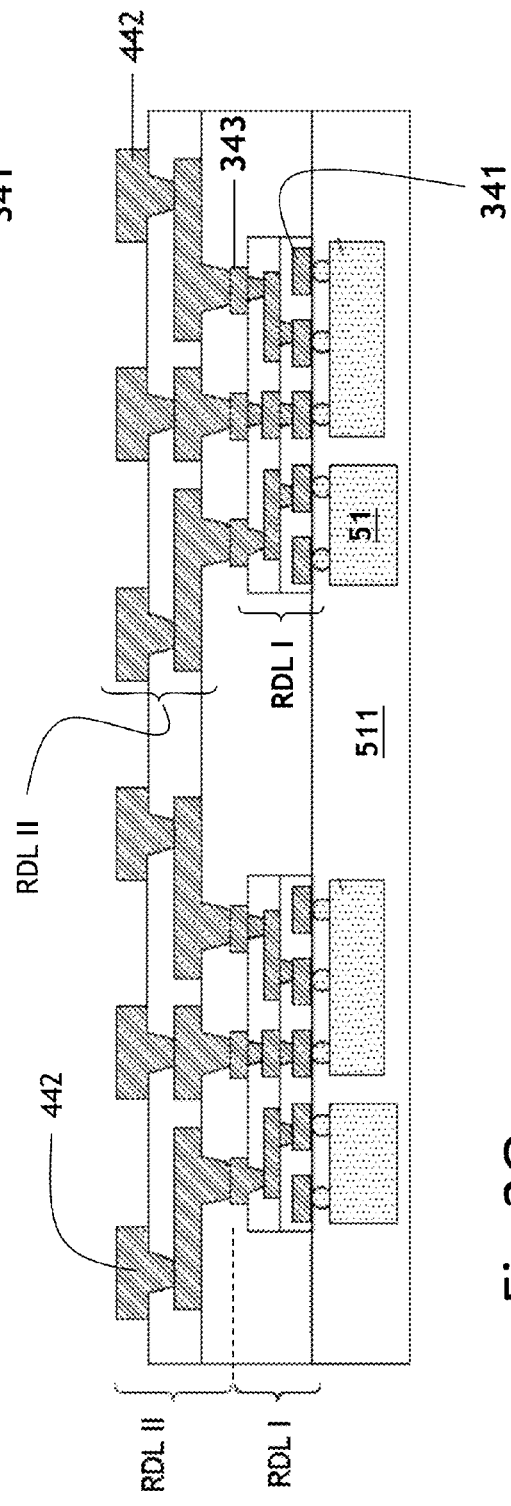

Fig.3

A process flow for fabricating a high density film, comprises:

fabricating a bottom redistribution layer RDL I following IC design rule, with a plurality of bottom pad 341 formed on bottom, and with a plurality of first top pad 343 formed on top; wherein the density of the plurality of bottom pad 341 is higher than the density of the plurality of first top pad 343; and fabricating a top redistribution layer RDL II following a PCB design rule, using the plurality of the first top pad 343 as a starting point; with a plurality of second top pad 442 formed on top; wherein a density of the plurality of first top pad 343 is higher than a density of the plurality of second top pad 442.

Fig.4

A process flow for fabricating a high density film, comprises:

preparing a temporary carrier I;
    applying a first release layer 31 on top of the temporary carrier I;
    forming a seed layer 32 on top of the first release layer 31;
    forming a plurality of bottom pad 341 on top of the seed layer 32;
    etching the seed layer 32 between the bottom pads 341;
    forming a bottom redistribution layer RDL I following IC design rule, using the plurality of bottom pad 341 as a starting point; with a plurality of first top pad 343 formed on top, to form a circuitry film RDL I;
    removing the temporary carrier I to release the circuitry film RDL I;
    singulating the circuitry film RDL I to produce a plurality of RDL I unit preparing a temporary carrier II;
    applying a second release layer 311 on top of the temporary carrier II;
    arranging a plurality of the RDL I unit on top of the second release layer 311;
    forming a second top redistribution layer RDL II following PCB design rule on top of the plurality of RDL I unit, using the first top pad 343 as a starting point, with a plurality of second top pad 442 formed on top; and
    removing the temporary carrier II to release a high density film (RDL I + RDL II).

A process flow for fabricating an IC package using the high density film according to the present invention, comprises:

preparing a high density film (RDL I + RDL II) prepared according to Fig.3 or Fig.4.

mounting at least one chip 51 on bottom of the bottom pad 341;

molding the chip 51 with a molding compound 511;

thinning the molding compound 511 to reveal bottom surface of the chip 51;

mounting a heat sink 53 on bottom of the chip 51; and singulating to produce a plurality of separated unit.

Fig.5

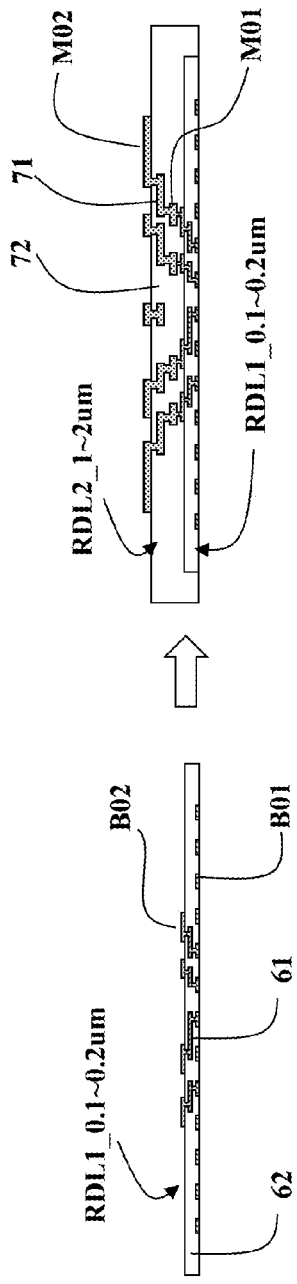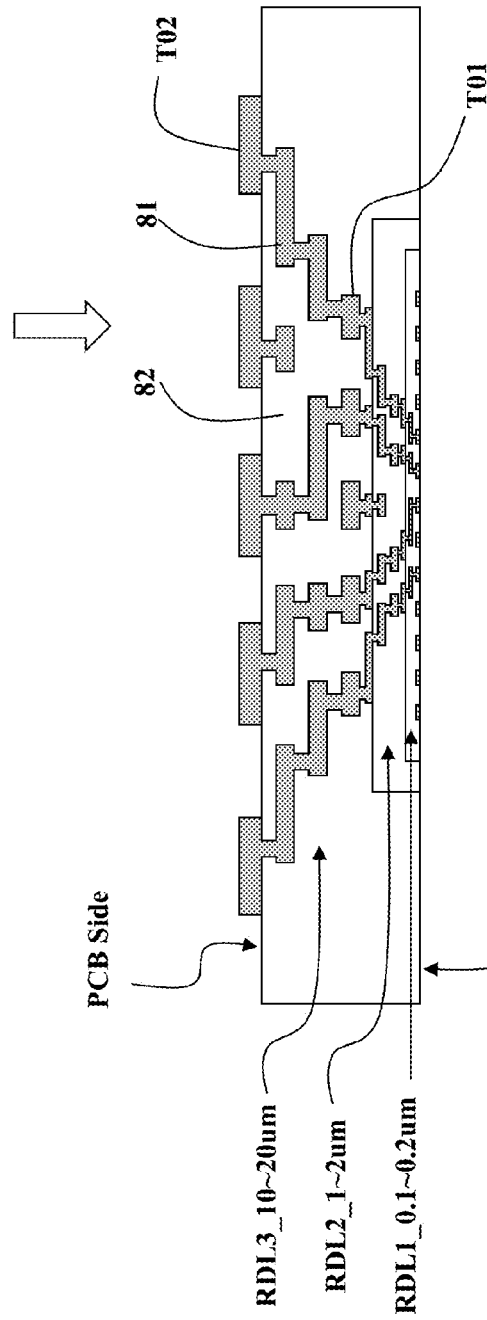

THIN FILM RDL FOR NANOCHIP PACKAGE

This application is a continuation-in-part application of U.S. application Ser. No. 14/509,395 filed Oct. 8, 2014 which is a continuation-in-part of U.S. application Ser. No. 14/308,702 filed Jun. 18, 2014 the disclosure of which is incorporated by reference herein in its entirety.

BACKGROUND

1. Technical Field

The present invention relates to a high density film adapted for a nanochip to pack, especially for a high density film without having any interposer like through silicon via (TSV) or through glass via (TGV) therein.

2. Description of Related Art

FIG. 1 shows a prior art substrate for IC package

FIG. 1 shows a prior art substrate for IC package disclosed in US2014/0102777A1 which has an embedded silicon interposer 20. The silicon interposer 20 has four later sides 206. A molding compound 22 wraps the silicon interposer 20 around the four lateral sides 206. A plurality of via metal 200 is made through the silicon interposer 20. An insulation liner 201 is made between the through via 200 and the silicon interposer 20 for an electrical insulation there-between. A top redistribution layer 21 is made on top of the silicon interposer 20 with a plurality of metal pad 210 exposed on top. The plurality of metal pad 210 on top is provided for accommodating an IC chip (not shown) to mount. A circuit built-up layer 25 is made on bottom of the silicon interposer 20 with a plurality of metal pad 220 configured on bottom. A plurality of solder ball 4 is configured and each solder ball 4 is configured on bottom of a corresponding bottom metal pad 220.

BRIEF DESCRIPTION OF THE DRAWINGS

FIGS. 2A~2M show a process for fabricating a high density film according to the present invention.

FIGS. 2N~2S show an IC package using the high density film according to the present invention.

FIG. 3 shows a process flow for fabricating a high density film according to the present invention.

FIG. 4 shows a further process flow for fabricating a high density film according to the present invention.

FIG. 5 shows a process flow for fabricating an IC package using the high density film according to the present invention.

FIGS. 6A~6D show a first process for preparing a nanochip package according the present invention.

DETAILED DESCRIPTION OF THE INVENTION

FIGS. 2A~2M show a process for fabricating a high density film according to the present invention.

Figure 1:
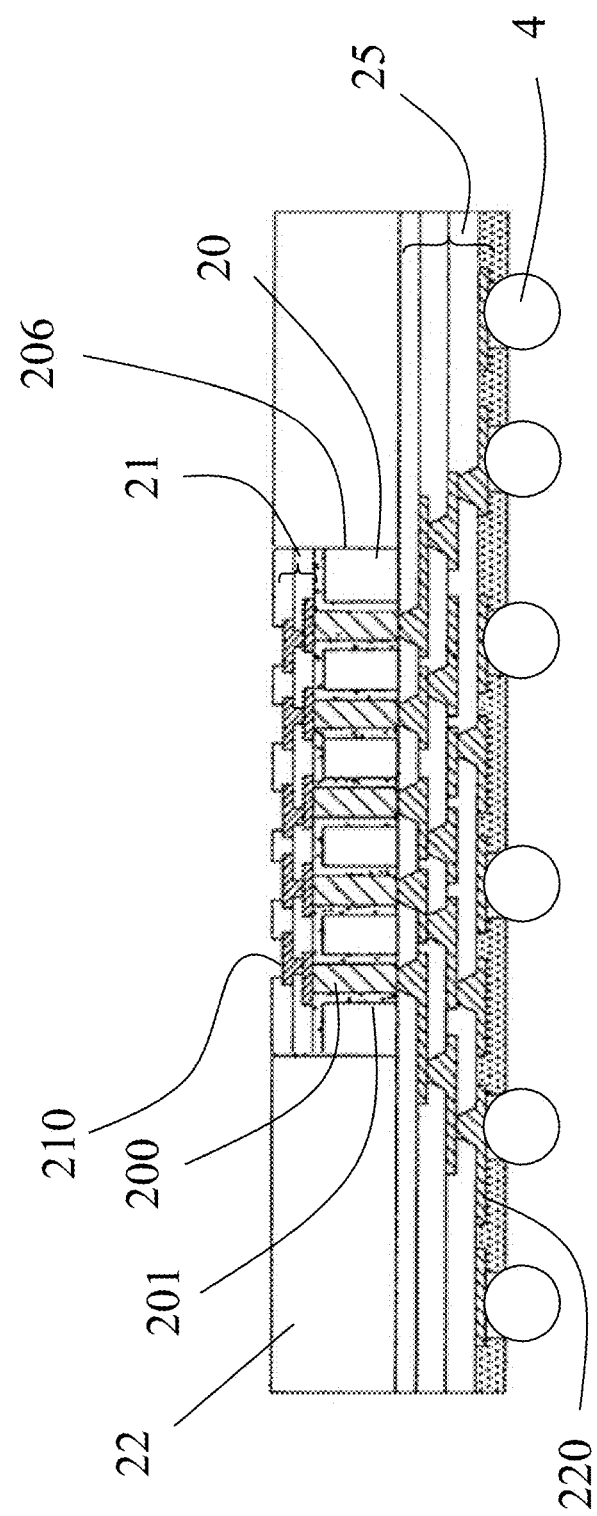
FIG. 1 shows a prior art IC package.
Figure 2A:
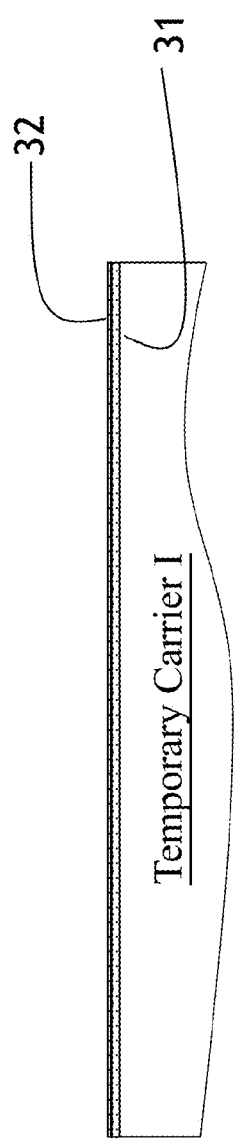

FIG. 2A shows a temporary carrier I is prepared, a first release layer 31 is applied on top of the temporary carrier I, and a seed layer 32, such Ti/Cu, is formed on top of the first release layer 31.

Figure 2B:
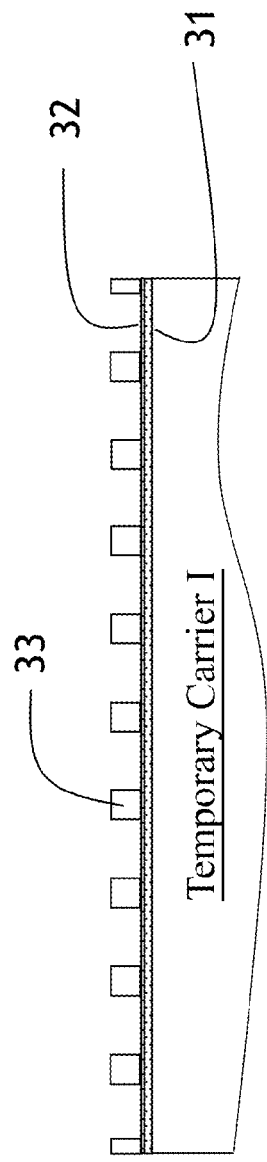

FIG. 2B shows a patterned photoresist 33 is formed on top of the seed layer 32.

Figure 2C:
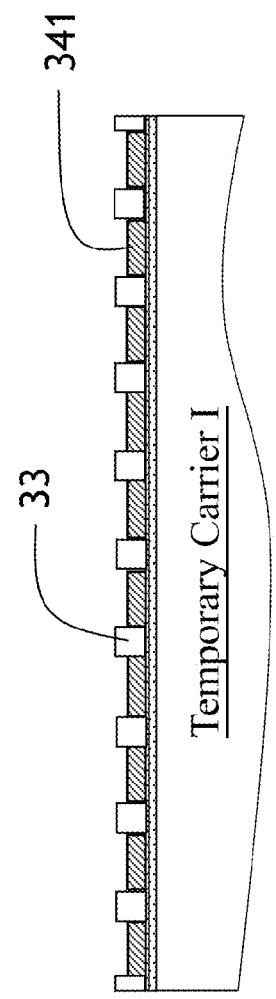

FIG. 2C shows a plurality of bottom pad 341 is formed on top of the seed layer 32.

FIG. 2D shows the patterned photoresist 33 is removed and a plurality of bottom pad 341 is left.

FIG. 2E shows the seed layer 32 between pads 341 are removed.

FIG. 2F shows a first redistribution circuitry 342 is formed following IC design rule, using the plurality of bottom pad 341 as a starting point, comprising the steps: a first dielectric layer 351 is applied on top of the bottom pad 341, and then a first redistribution circuitry 342 is formed through traditional technique.

Figure 2G:
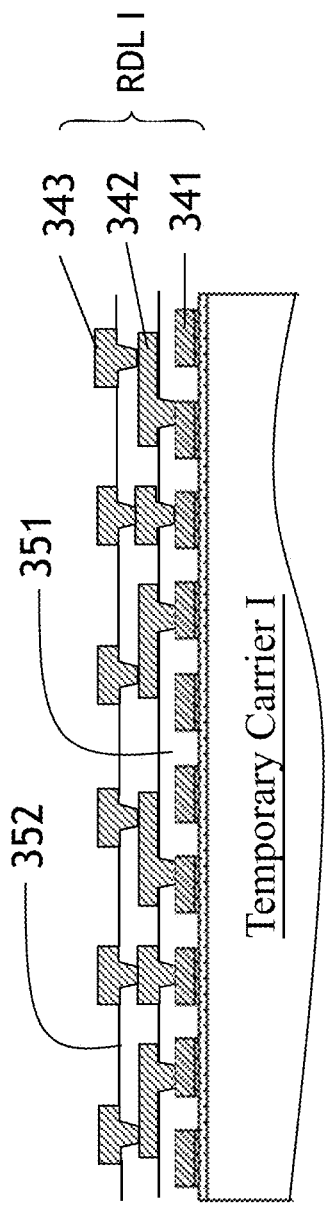

FIG. 2G shows a plurality of first top pad 343 is formed comprising the following steps: a second dielectric layer 352 is applied on top of the first redistribution circuitry 342, a plurality of first top pad 343 is formed through traditional technique. A first redistribution circuitry 342 and a plurality of first top pad 343 are exemplified in this embodiment. The redistribution circuitry layer can be repeatedly processed to even more layers to fan out the circuitry if desired. The bottom pad 341, the first redistribution circuitry 342 and the first top pad 343 are collectively called circuitry film RDL I.

Figure 2H:
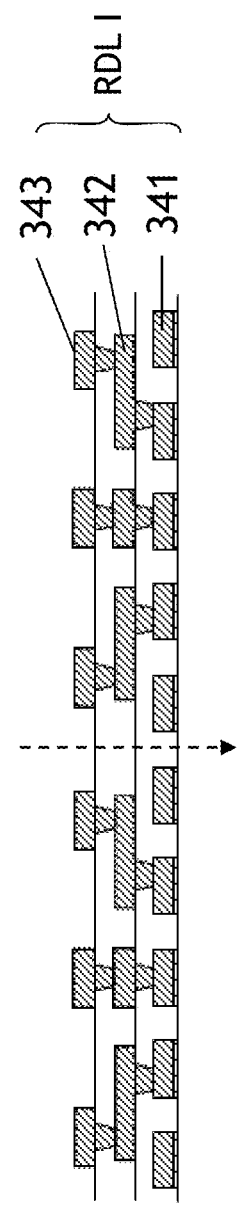

FIG. 2H shows the temporary carrier I is removed to form a circuitry film RDL I. And then a singulating process is performed to produce a plurality of single unit of circuitry film RDL I.

Figure 2I:
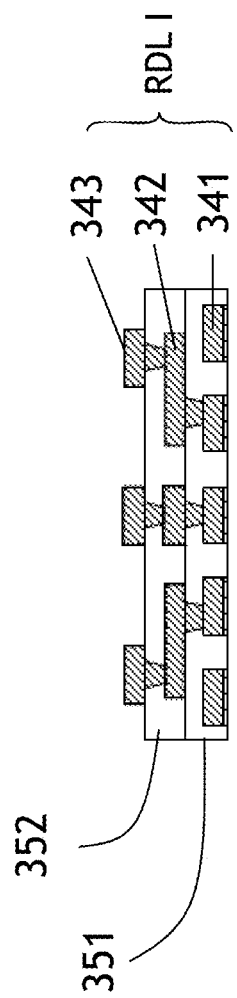

FIG. 2I shows a single unit of circuitry film RDL I.

Figure 2J:
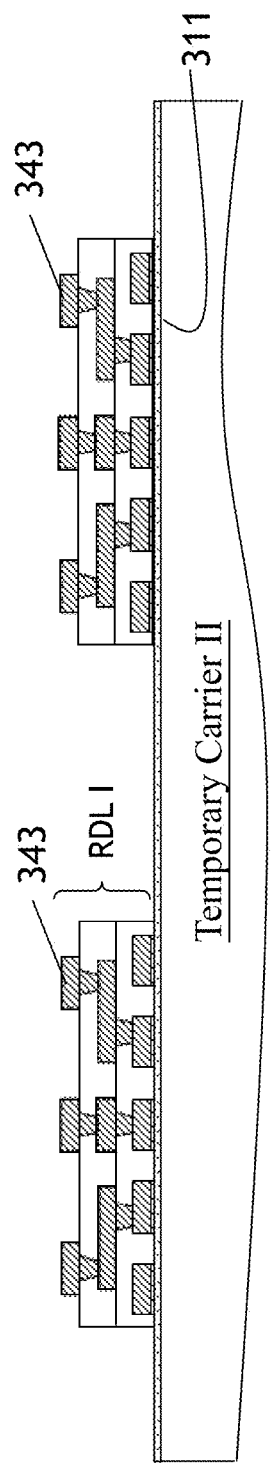

FIG. 2J shows a temporary carrier II is prepared. A second release layer 311 is applied on top of the temporary carrier II. A plurality of circuitry film RDL I is arranged on top of the second release layer 311.

Figure 2K:
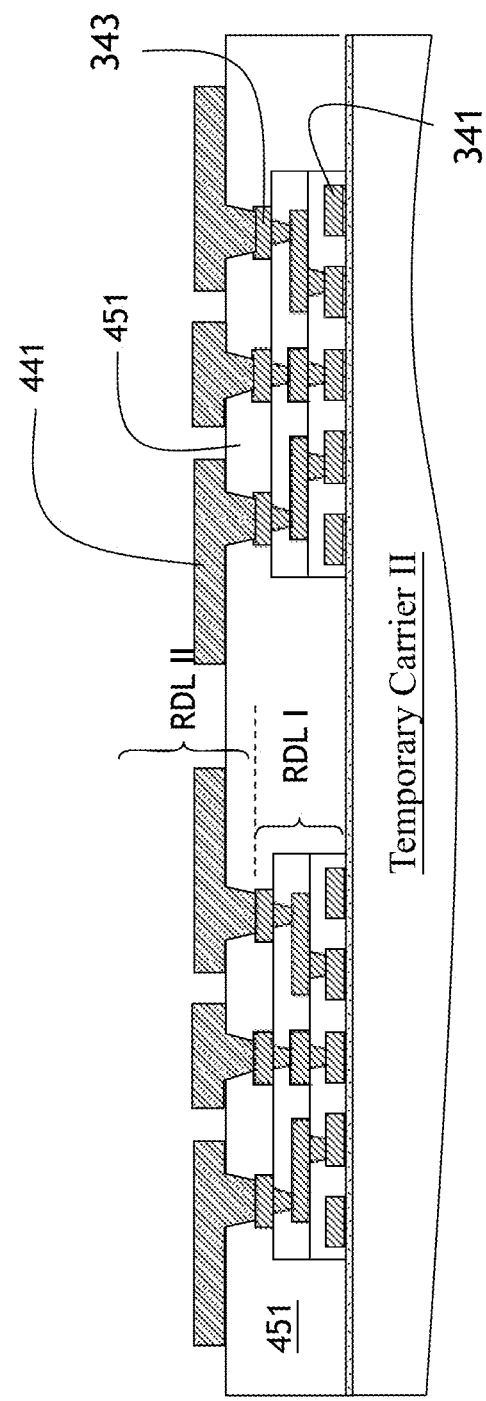

FIG. 2K shows a second redistribution circuitry 441 is formed following PCB design rule, using the plurality of first top pad 343 as a starting point, comprising the steps: a third dielectric layer 451 is applied on top of the circuitry film RDL I, and then a second redistribution circuitry 441 is formed through traditional technique.

The dielectric layer used for PCB process can be one of Ajinomoto build-up films (ABF) or Pre-preg (PP).

Figure 2L:
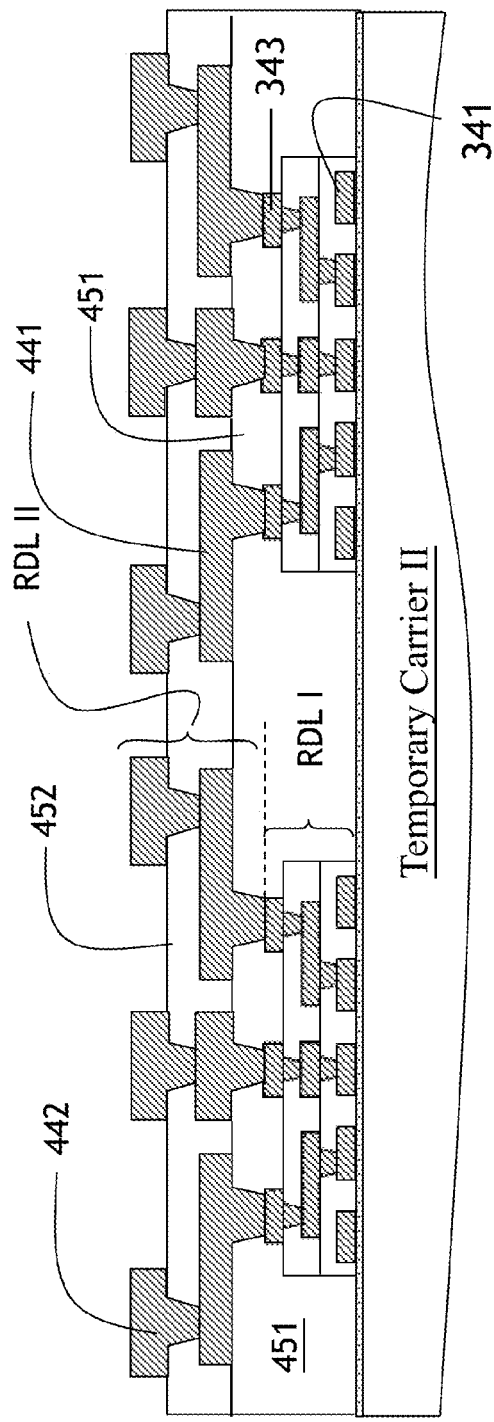

FIG. 2L shows a plurality of second top pad 442 is formed, comprising the steps: a fourth dielectric layer 452 is applied on top of the second redistribution circuitry 441 and the third dielectric layer 451, a plurality of second top pad 442 is formed through traditional technique. A second redistribution circuitry 441 and a plurality of second top pad 442 are exemplified in this embodiment. The redistribution circuitry can be repeatedly processed to even more layers to fan out the circuitry if desired. The redistribution circuitry 441 and the second top pad 442 are collectively called circuitry film RDL II. A high density film (RDL I+RDL II) is formed on top of the second release layer 311.

Figure 2M:
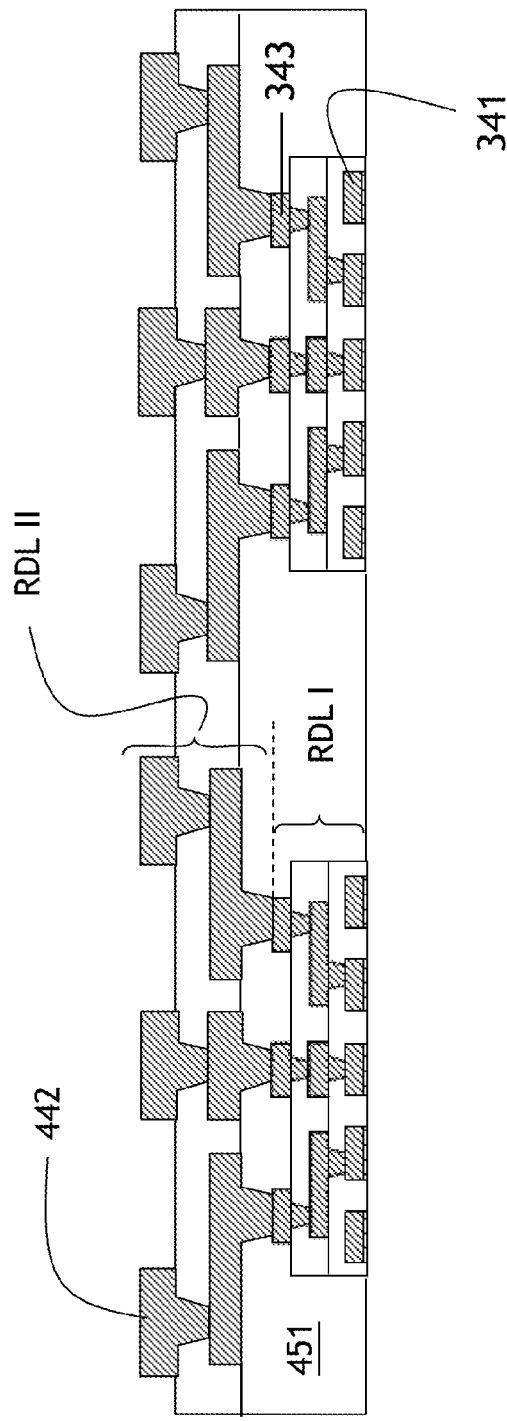

FIG. 2M shows the temporary carrier II is removed, and a high density film (RDL I+RDL II) is released.

FIGS. 2N~2S show a fabricating process for an IC package using the high density film according to the present invention.

FIG. 2N shows at least one chip 51 is mounted on a bottom of the bottom pad 341.

FIG. 2O shows a molding compound 511 is applied to encapsulate the chip or chips 51.

Figure 2P:
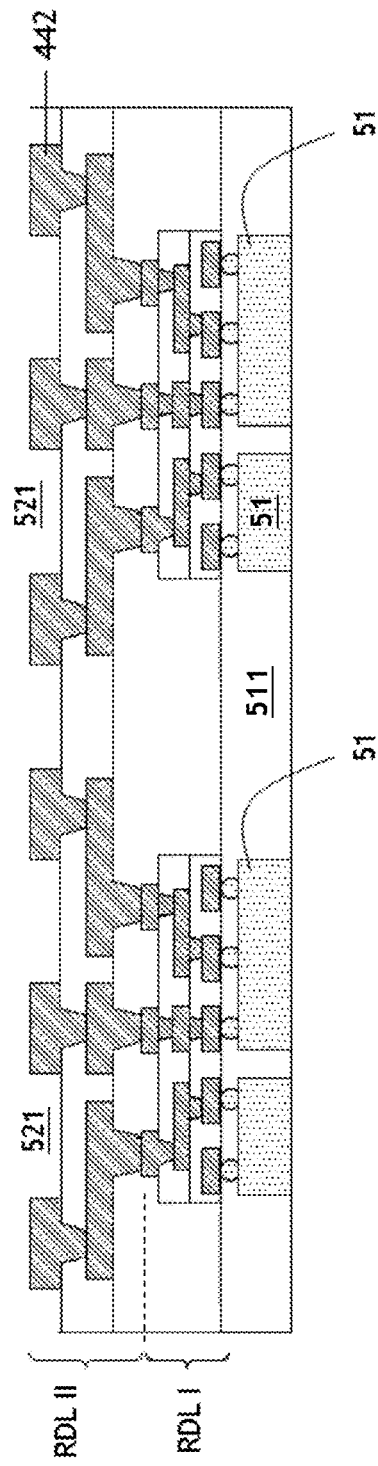

FIG. 2P shows a thinning process is applied onto the molding compound 511 to reveal a bottom surface of the chip 51 for heat dissipation of the chip.

Figure 2Q:
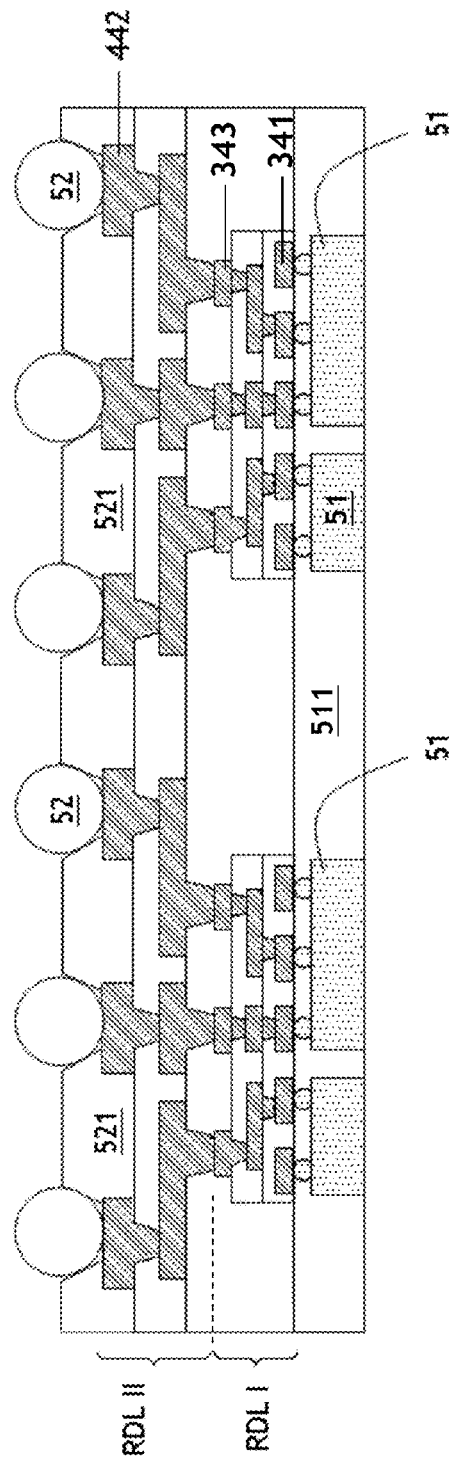

FIG. 2Q shows a dielectric layer 521 is applied between the second top pads 442, and a plurality of solder ball 52 is planted, each solder ball 52 is configured on top of a corresponding top pad 442.

Figure 2R:
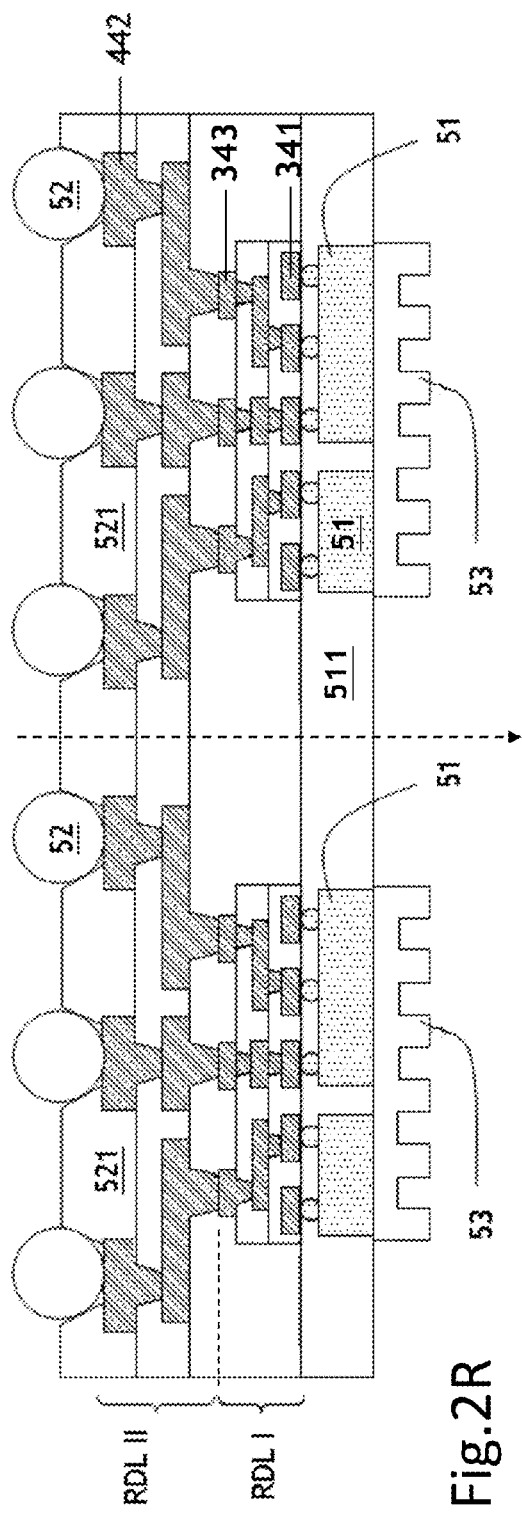

FIG. 2R shows a heat sink 53 is configured on a bottom surface of the chip 51 for further heat dissipation.

Figure 2S:
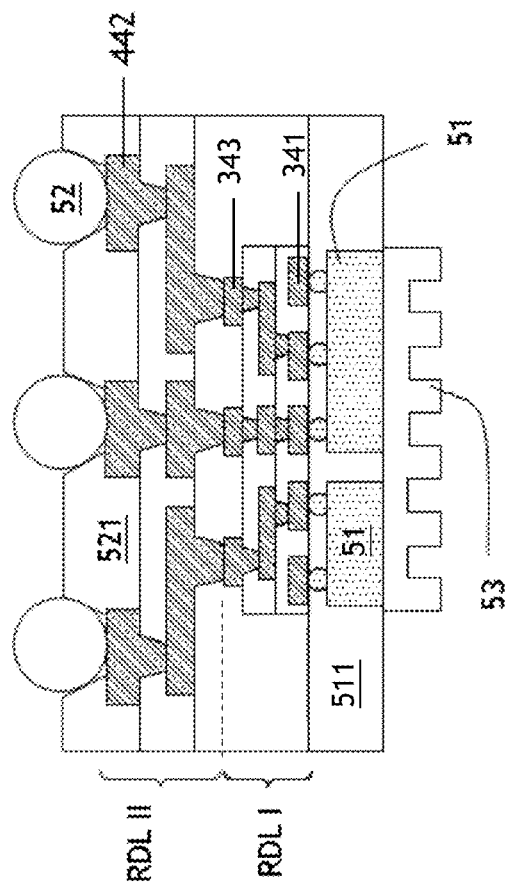

FIG. 2S shows a single unit of the IC package is formed after a singulating process applied on the product of FIG. 2R.

FIG. 3 shows a process flow for fabricating a high density film according to the present invention, comprises:

fabricating a bottom redistribution layer RDL I following IC design rule, with a plurality of bottom pad 341 formed on bottom, and with a plurality of first top pad 343 formed on top; wherein the density of the plurality of bottom pad 341 is higher than the density of the plurality of first top pad 343; and fabricating a top redistribution layer RDL II following PCB design rule, using the plurality of the first top pad 343 as a starting point; with a plurality of second top pad 442 formed on top; wherein a density of the plurality of first top pad 343 is higher than a density of the plurality of second top pad 442.

FIG. 4 shows a further process flow for fabricating a high density film, comprises:

preparing a temporary carrier I;

applying a first release layer 31 on top of the temporary carrier I;

forming a seed layer 32 on top of the first release layer 31;

forming a plurality of bottom pad 341 on top of the seed layer;

etching the seed layer between the bottom pads 341;

forming a bottom redistribution layer RDL I following IC design rule, using the bottom pad 341 as a starting point; with a plurality of first top pad 343 formed on top, to form circuitry film RDL I;

removing the temporary carrier I to release the circuitry film RDL I;

singulating the circuitry film RDL I to produce a plurality of RDL I unit preparing a temporary carrier II;

applying a second release layer 311 on top of the temporary carrier II;

arranging a plurality of the RDL I unit on top of the second release layer 311;

forming a second top redistribution layer RDL II following PCB design rule on top of the plurality of RDL I unit, using the first top pad 343 as a starting point; with a plurality of second top pad 442 formed on top; and removing the temporary carrier II to release a high density film (RDL I+RDL II).

FIG. 5 shows a process flow for fabricating an IC package using the high density film according to the present invention, comprises:

removing the temporary carrier I to release the bottom redistribution layer RDL I;

singulating the bottom redistribution layer RDL I to produce a plurality of RDL I unit;

preparing a temporary carrier II;

applying a second release layer 311 on top of the temporary carrier 11;

arranging a plurality of the RDL I unit on a top of the second release layer 311;

forming a second top redistribution layer RDL II following PCB design rule on top of the plurality of RDL I unit, using the plurality of first top pad 343 as a starting point; with a plurality of second top pad 442 formed on top;

removing the temporary carrier II to release a high density film (RDL I+RDL II);

mounting at least one chip 51 on bottom of the plurality of bottom pad 341;

molding the chip 51 with a molding compound 511;

thinning the molding compound 511 from bottom to reveal the bottom surface of the chip 51;

mounting a heat sink 53 on bottom of the chip 51; and singulating to produce a plurality of separated unit.

FIGS. 6A~6D show a first process for preparing a nanochip package according the present invention.

FIG. 6A shows a first redistribution layer built-up.

FIG. 6A shows a first redistribution layer (RDL1) is prepared through similar processes as described in FIGS. 2A~2H. The first redistribution layer (RDL1) has a first redistribution circuit 61 and a first dielectric layer 62. The first redistribution circuit 61 is embedded in the first dielectric layer 62. The first redistribution circuit 61 has a plurality of first bottom pads B01 configured on bottom adapted for at least one nanochip to mount thereon in a later process. The first redistribution circuit 61 has a plurality of first top pads B02 configured on top of the first dielectric layer 62. A density of the first bottom pads B01 is roughly ten times a density of the first top pads B02. The first redistribution circuit 61 is built-up following design rules of around 0.1~0.2 um.

FIG. 6B shows a second redistribution layer built-up on a top surface of the first redistribution layer.

FIG. 6B shows a second redistribution layer (RDL2) is built-up on a top surface of the first redistribution layer (RDL1). The second redistribution layer (RDL2) is prepared through similar processes as described in FIGS. 2J-2M. The second redistribution layer (RDL2) has a second redistribution circuit 71 and a second dielectric layer 72. The second redistribution circuit 71 is embedded in the second dielectric layer 72. The second redistribution circuit 71 has a plurality of second bottom pads M01 configured on bottom electrically coupled to the first top pads B02. The second redistribution circuit 71 has a plurality of second top pads M02 configured on top of the second dielectric layer 72. A density of the second bottom pads M01 is roughly ten times a density of the second top pads M02. The second redistribution circuit 71 is built-up following design rules of around 1~2 um.

FIG. 6C shows a third redistribution layer built-up on a top surface of the second redistribution layer.

FIG. 6C shows a third redistribution layer (RDL3) is built-up on a top surface of the second redistribution layer (RDL2). The third redistribution layer (RDL3) is prepared through similar processes as described in FIGS. 2J~2M or through a traditional lamination process. The third redistribution layer (RDL3) has a third redistribution circuit 81 and a third dielectric layer 82. The third redistribution circuit 81 is embedded in the third dielectric layer 82. The third redistribution circuit 81 has a plurality of third bottom pads T01 configured on bottom electrically coupled to the second top pads M02. The third redistribution circuit 81 has a plurality of third top pads T02 configured on top of the third dielectric layer 82. A density of the third bottom pads T01 is roughly ten times a density of the third top pads T02. The third redistribution circuit 81 is built-up following design rules of around 10~20 um. The top surface of the third redistribution layer (RDL3) is a PCB side, i.e. a side adapted for the package to mount onto a printed circuit board in a later process. The bottom surface of the first redistribution layer (RDL1) is a chip side, i.e. a side adapted for at least one nanochip to mount thereon in a later process.

Figure 6D:
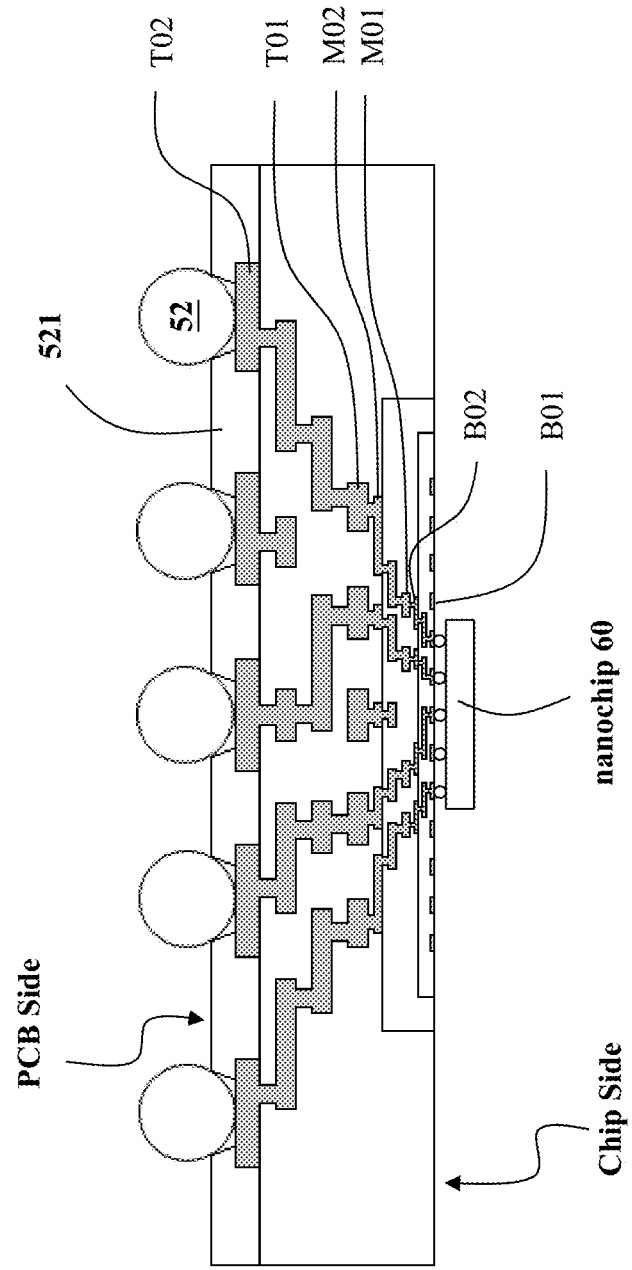

FIG. 6D shows solder balls mounted

FIG. 6D shows a layer of solder resist 521 can be applied and expose a top surface of each corresponding top pads T02. A plurality of solder balls 52 are prepared, each solder balls is mounted on a corresponding top pads T02. A nanochip 60 is mounted on a bottom surface of the first bottom pads B01.

Figure 7A:
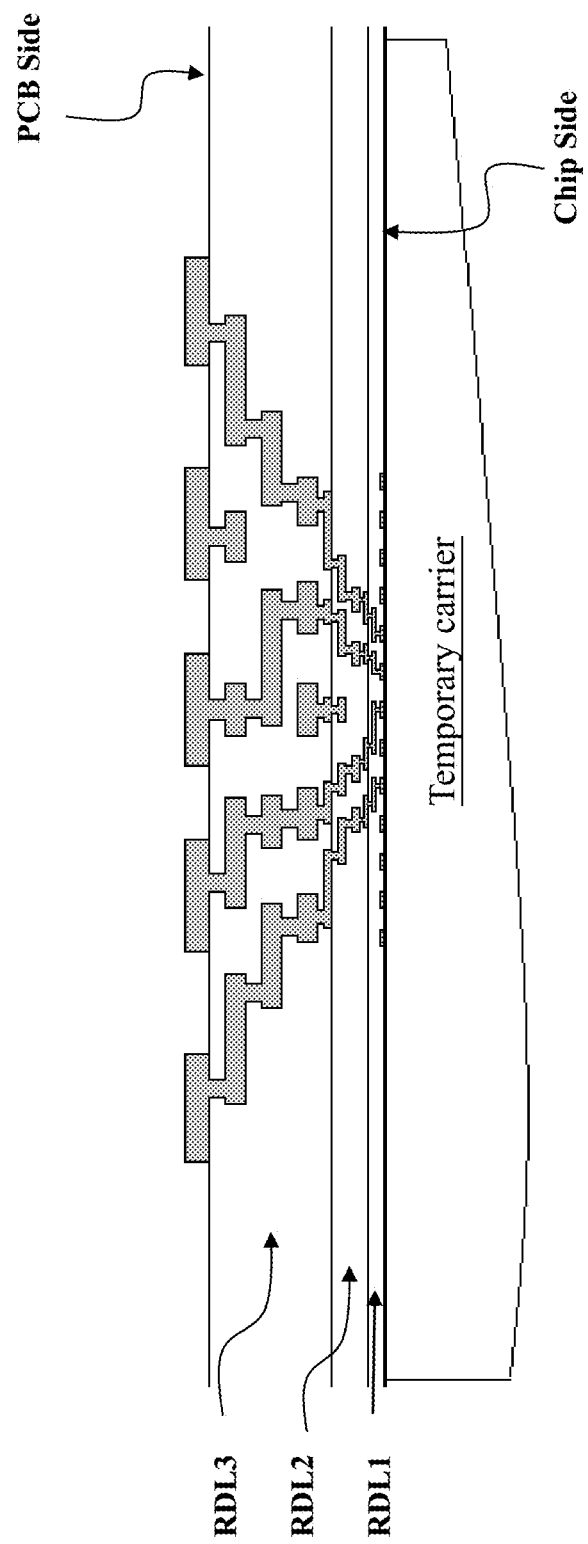
FIGS. 7A~7C show a second process for preparing a nanochip package according the present invention.
Figure 7B:
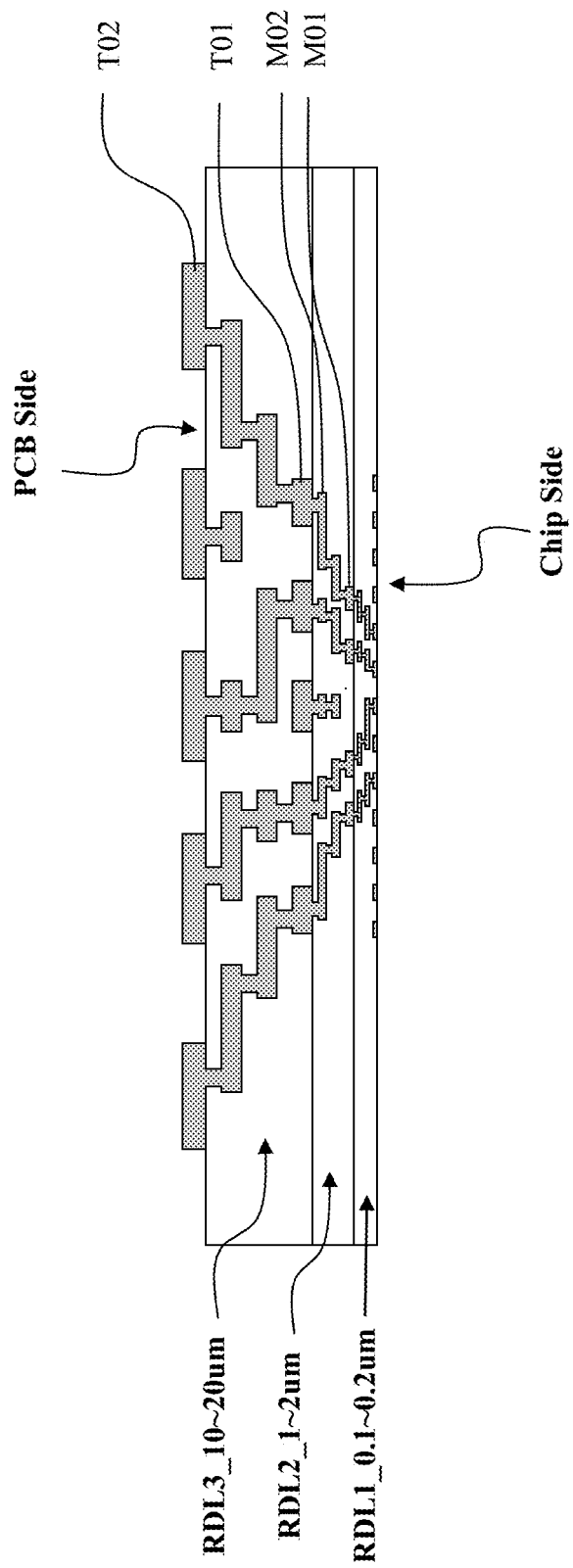
Figure 7C:
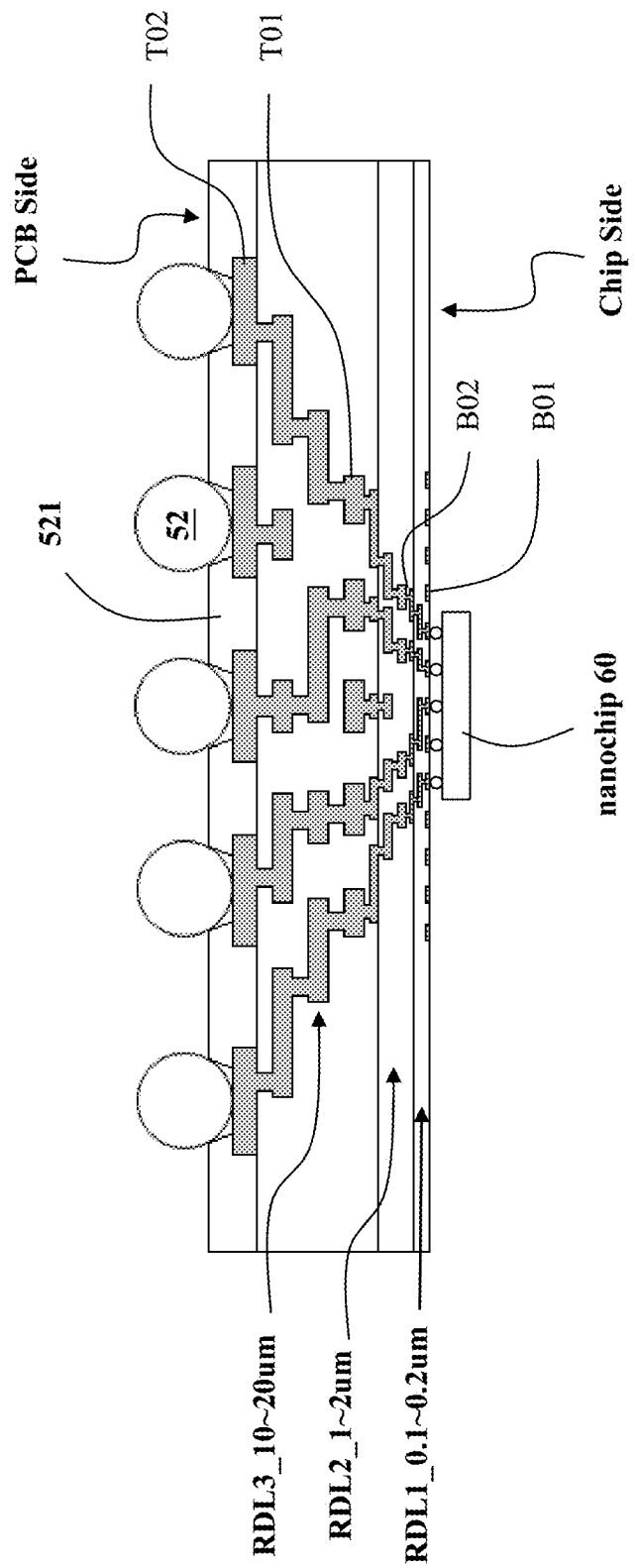

FIGS. 7A~7C show a second process for preparing a nanochip package according the present invention.

FIG. 7A shows a second process to preparing a nanochip package. Firstly, a temporary carrier is prepared; and forming a first redistribution layer (RDL1) on top of the temporary carrier. The first redistribution layer (RDL1) has a first redistribution circuit 61 and a first dielectric layer 62. The bottom redistribution circuit 61 has a plurality of first bottom pads B01 adapted for at least one nanochip to mount; and has a plurality of first top pads B02; wherein a density of the first bottom pads B01 is higher than a density of the first top pads B02;

forming a second redistribution layer (RDL2) on top of the first redistribution layer (RDL1). The second redistribution layer (RDL2) has a second redistribution circuit 71 and a second dielectric layer 72. The second redistribution circuit (71) has a plurality of second bottom pads M01 electrically coupled to the first top pads B02; and has a plurality of second top pads M02; wherein a density of the second bottom pads M01 is higher than a density of the second top pads M02; and forming a third redistribution layer (RDL3) on top of the second redistribution layer (RDL2. The third redistribution layer (RDL3) has a third redistribution circuit 81 and a third dielectric layer 82. The third redistribution circuit 81 has a plurality of third bottom pads T01 electrically coupled to the second top pads M02, and has a plurality of third top pads T02; wherein a density of the third bottom pads T01 is higher than a density of the third top pads T02.

FIG. 7B shows:

detaching the temporary carrier from the high density circuit film;

singulating the high density circuit film, if a plurality of units have been fabricated in the same process, into a plurality of units.

FIG. 7C shows:

mounting a nanochip 60 onto the first bottom pads B01;

applying a solder resist 521 on a top surface of the third dielectric layer 82;

exposing a top surface of each third top pads T02; and planting a plurality of solder balls 52, each configured on a top surface of a corresponding top pad 102.

Figure 8:
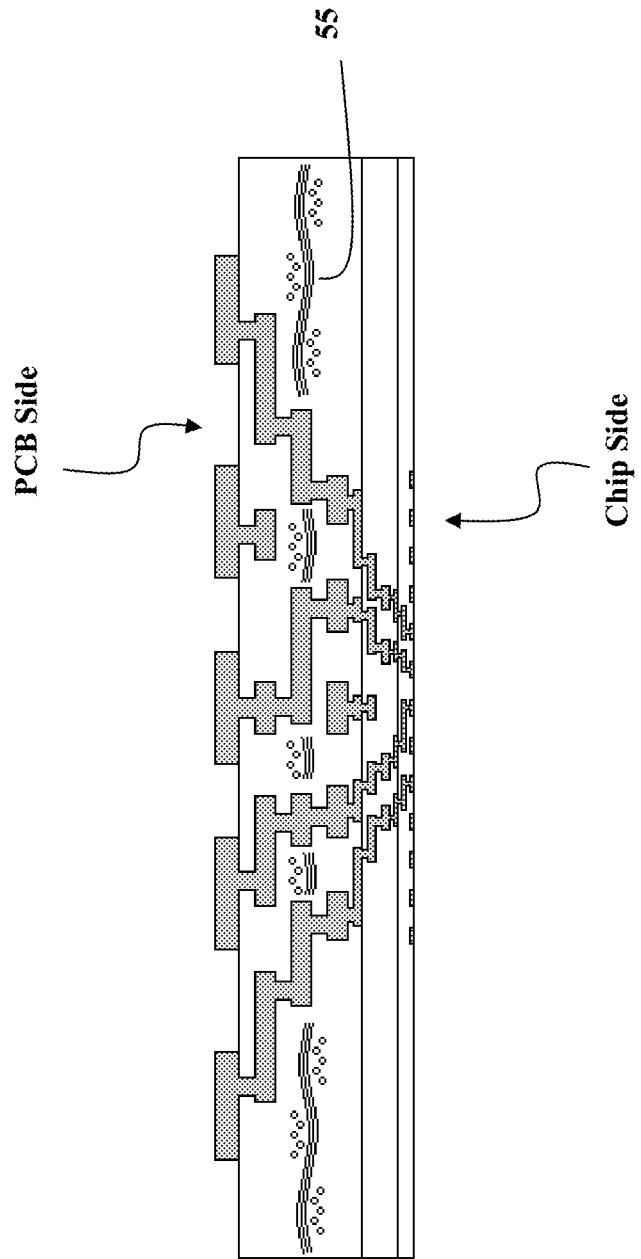
FIG. 8 shows a modified embodiment according to the present invention.

FIG. 8 shows a modified embodiment according to the present invention.

Since the high density film disclosed in the present invention is very thin roughly 50-200 um in total thickness, in order to enhance the stiffness or mechanical strength of the high density film for easy handling, fiber-based filler 55 can be embedded in one of the dielectric layer or molding compound to reinforce the strength of the high density film according to the present invention.

While several embodiments have been described by way of example, it will be apparent to those skilled in the art that various modifications may be configured without departs from the spirit of the present invention. Such modifications are all within the scope of the present invention, as defined by the appended claims.

What is claimed is:

1. A thin film RDL for nanochip package, comprising:
   a bottom redistribution circuit, having a plurality of first bottom pads adapted for at least one nanochip to mount; and having a plurality of first top pads; wherein a density of the first bottom pads is higher than a density of the first top pads;
   a middle redistribution circuit formed on top of the bottom redistribution circuit, having a plurality of second bottom pads electrically coupled to the first top pads, and having a plurality of second top pads; wherein a density of the second bottom pads is higher than a density of the second top pads; and
   a top redistribution circuit formed on top of the middle redistribution circuit, having a plurality of third bottom pads electrically coupled to the second top pads, and having a plurality of third top pads; wherein a density of the third bottom pads is higher than a density of the third top pads.

2. A thin film RDL for nanochip package as claimed in claim 1, further comprising:
   at least a nanochip, electrically coupled to the first bottom pads.

3. A thin film RDL for nanochip package as claimed in claim 1, wherein
   the bottom redistribution circuit is fabricated following design rules of around 0.1 um;
   the middle redistribution circuit is fabricated following design rules of around 1 um; and
   the bottom redistribution circuit is fabricated following design rules of around 10 um.

4. A thin film RDL for nanochip package as claimed in claim 1, wherein
   the density of the first bottom pads is around ten times the density of the first top pads;
   the density of the second bottom pads is around ten times the density of the second top pads; and
   the density of the third bottom pads is around ten times the density of the third top pads.

5. A thin film RDL for nanochip package as claimed in claim 1, further comprises
   a plurality of dielectric layers, each embeds one of the redistribution circuits; and
   a fiber-based filler is filled in at least one of the dielectric layers.

6. A process for fabricating a nanochip package, comprising:
   forming a bottom redistribution circuit; the bottom redistribution circuit has a plurality of first bottom pads adapted for at least one nanochip to mount; and has a plurality of first top pads; wherein a density of the first bottom pads is higher than a density of the first top pads;
   forming a middle redistribution circuit on top of the bottom redistribution circuit; the middle redistribution circuit has a plurality of second bottom pads electrically coupled to the first top pads; and has a plurality of second top pads; wherein a density of the second bottom pads is higher than a density of the second top pads; and
   forming a top redistribution circuit on top of the middle redistribution circuit; the top redistribution circuit has a plurality of third bottom pads electrically coupled to the second top pads, and has a plurality of third top pads; wherein a density of the third bottom pads is higher than a density of the third top pads.

7. A process for fabricating a nanochip package as claimed in claim 6, further comprising:
   preparing at least a nanochip; and
   coupling the nanochip onto the first bottom pads.

8. A process for fabricating a nanochip package as claimed in claim 6, wherein
   the bottom redistribution circuit is fabricated following design rules of around 0.1 um;
   the middle redistribution circuit is fabricated following design rules of around 1 um; and
   the bottom redistribution circuit is fabricated following design rules of around 10 um.

9. A process for fabricating a nanochip package as claimed in claim 6, wherein
   the density of the first bottom pads is around ten times the density of the first top pads;
   the density of the second bottom pads is around ten times the density of the second top pads; and the density of the third bottom pads is around ten times the density of the third top pads.

10. A process for fabricating a nanochip package as claimed in claim 6, wherein the RDL comprising:
   a first dielectric layer embeds the first redistribution circuit;
   a second dielectric layer embeds the second redistribution circuit;
   a third dielectric layer embeds the third redistribution circuit; and
   a fiber-based filler is filled in at least one of the dielectric layers.

* * * * *